(12) United States Patent
Darden et al.

(10) Patent No.: US 7,278,127 B2
(45) Date of Patent: Oct. 2, 2007

(54) OVERLAPPING SHAPE DESIGN RULE ERROR PREVENTION

(75) Inventors: Laura R. Darden, Essex Junction, VT (US); Mark R. Lasher, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 452 days.

(21) Appl. No.: 10/710,914

(22) Filed: Aug. 12, 2004

(65) Prior Publication Data
US 2006/0036986 A1   Feb. 16, 2006

(51) Int. Cl.
G06F 17/50 (2006.01)
(52) U.S. Cl. ............ 716/13; 716/12; 716/14; 716/15; 716/16
(58) Field of Classification Search ............ 716/12–16
See application file for complete search history.

(56) References Cited

U.S. PATENT DOCUMENTS

| | | | |
|---|---|---|---|
| 4,837,447 A * | 6/1989 | Pierce et al. ............. | 250/492.2 |
| 5,159,201 A * | 10/1992 | Frei ........................ | 250/492.2 |
| 5,491,641 A * | 2/1996 | Scepanovic et al. .......... | 716/13 |
| 5,822,214 A * | 10/1998 | Rostoker et al. .............. | 716/10 |
| 6,044,208 A | 3/2000 | Papadopoulou et al. | |
| 6,178,539 B1 | 1/2001 | Papadopoulou et al. | |
| 6,301,689 B1 | 10/2001 | Darden | |
| 6,324,673 B1 * | 11/2001 | Luo et al. ..................... | 716/11 |
| 6,792,587 B2 * | 9/2004 | Xing et al. .................. | 716/12 |
| 2001/0042236 A1 | 11/2001 | Darden | |

OTHER PUBLICATIONS

Pineda de Gyvezet al., "IC defect sensitivity for footprint-type spot defects", Computer-Aided Design of Integrated Circuits and Systems, IEEE Transactions on vol. 11, Issue 5, May 1992 pp. 638-658.*

* cited by examiner

*Primary Examiner*—Thuan Do
*Assistant Examiner*—Naum Levin
(74) *Attorney, Agent, or Firm*—Richard M. Kotulak; Hoffman, Warnick & D'Alessandro LLC

(57) ABSTRACT

A method, system and program product are disclosed that create new shapes at detected shape overlaps and includes those new shapes during routing and net checking when the new shapes require a larger space than any of the overlapping shapes. The invention thus detects and prevents spacing errors without the expense of time consuming design rule checking (DRC), facilitating early detection and prevention of errors.

20 Claims, 3 Drawing Sheets

OVERLAPPING SHAPE DESIGN RULE ERROR PREVENTION

BACKGROUND OF INVENTION

1. Technical Field

The present invention relates generally to integrated circuit (IC) design, and more particularly, to a method, system and program product for detecting and preventing design rule errors due to overlapping shapes.

2. Related Art

Integrated circuits are commonly designed on computerized design systems that allow for layout and design rule spacing evaluation. Design rule spacing constraints are implemented to prevent IC parts from being too close together such that, for example, shorts may result. Accordingly, design rule constraints are often based on metal width. Design shapes are generally represented in computerized design systems as shapes or collections of shapes. When two or more metal shapes of an IC design overlap, the resulting metal shape has the potential to require a larger space than the individual shapes due to its increased width. Conventional gridded detail routers, such as IBM Signal Router, do not consider overlapping shapes and may route wires such that spacing constraints are violated by the overlapping shapes. Similarly, conventional power routers have the same problem. Heretofore, these design rule errors were only detected by design rule checking (DRC) late in the design cycle. As a result, routing steps and DRC is often repeated numerous times before an IC design is design rule compliant.

In view of the foregoing, there is a need in the art for a solution that addresses the problems of the related art.

SUMMARY OF INVENTION

The invention includes a method, system and program product that creates new shapes at detected shape overlaps and includes those new shapes during routing and net checking when the new shapes require a larger space than any of the overlapping shapes. The invention thus detects and prevents spacing errors without the expense of time consuming design rule checking (DRC), facilitating early detection and prevention of errors.

A first aspect of the invention is directed to a method of designing an integrated circuit (IC) design, the method comprising the steps of: determining net shapes for a net; sorting edges of the net shapes in preparation for a plane sweep into a sorted list; using a plane sweep algorithm to detect an intersection of at least two shapes; creating a new shape from the intersecting shapes in the case that the intersection is not totally contained by one of the intersecting shapes, and adding the new shape to an active list of the plane sweep; adding the new shape to a shapes list for the net in the case that the new shape requires a larger spacing than the intersecting shapes; and routing the IC design and including the new shape on a shapes list for the net as a blockage to prevent spacing errors during routing.

A second aspect of the invention is directed to a system for designing an integrated circuit (IC) design, the system comprising: means for determining net shapes for a net; means for sorting edges of the net shapes in preparation for a plane sweep into a sorted list; means for using a plane sweep algorithm to detect an intersection of at least two shapes; means for creating a new shape from the intersecting shapes in the case that the intersection is not totally contained by one of the intersecting shapes, and adding the new shape to an active list of the plane sweep; means for adding the new shape to a shapes list for the net in the case that the new shape requires a larger spacing than the intersecting shapes; and means for routing the IC design and including the new shape on a shapes list for the net as a blockage to prevent spacing errors during routing.

A third aspect of the invention is directed to a computer program product comprising a computer useable medium having computer readable program code embodied therein for designing an integrated circuit (IC) design, the program product comprising: program code configured to determine net shapes for a net; program code configured to sort edges of the net shapes in preparation for a plane sweep into a sorted list; program code configured to use a plane sweep algorithm to detect an intersection of at least two shapes; program code configured to create a new shape from the intersecting shapes in the case that the intersection is not totally contained by one of the intersecting shapes, and adding the new shape to an active list of the plane sweep; program code configured to add the new shape to a shapes list for the net in the case that the new shape requires a larger spacing than the intersecting shapes; and program code configured to route the IC design and including the new shape on a shapes list for the net as a blockage to prevent spacing errors during routing.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein.

DETAILED DESCRIPTION

Figure 1:
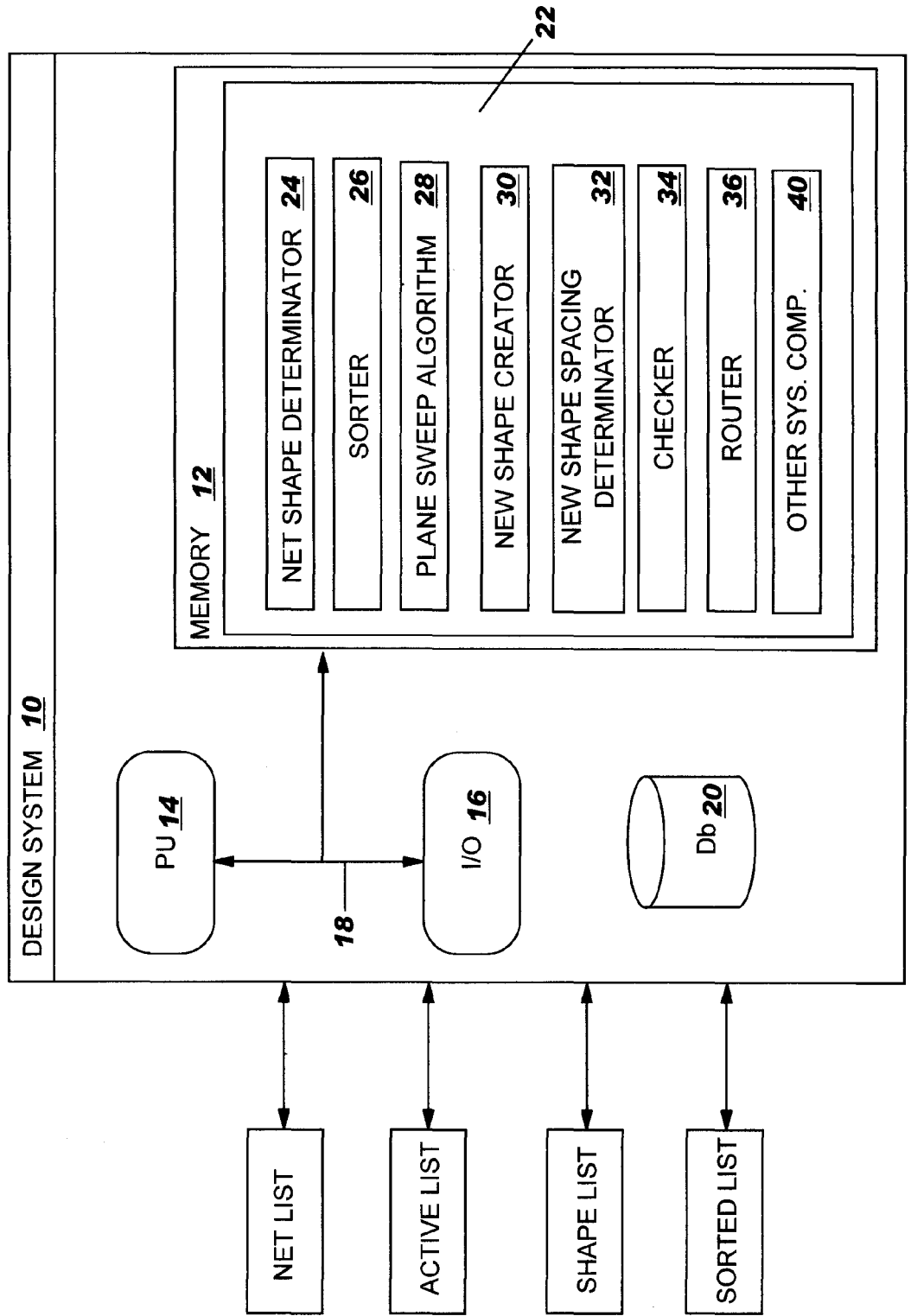
FIG. 1 shows a block diagram of a design system according to one embodiment of the invention.

With reference to the accompanying drawings, FIG. 1 is a block diagram of a design system 10 in accordance with an embodiment of the invention. System 10 includes a memory 12, a processing unit (PU) 14, input/output devices (I/O) 16 and a bus 18. A database 20 may also be provided for storage of data relative to processing tasks. Memory 12 includes a program product 22 that, when executed by PU 14, comprises various functional capabilities described in further detail below. Memory 12 (and database 20) may comprise any known type of data storage system and/or transmission media, including magnetic media, optical media, random access memory (RAM), read only memory (ROM), a data object, etc. Moreover, memory 12 (and database 20) may reside at a single physical location comprising one or more types of data storage, or be distributed across a plurality of physical systems. PU 14 may likewise comprise a single processing unit, or a plurality of processing units distributed across one or more locations. I/O 16 may comprise any known type of input/output device including a network system, modem, keyboard, mouse, scanner, voice recognition system, CRT, printer, disc drives, etc. Additional components, such as cache memory, communication systems, system software, etc., may also be incorporated into system 10.

As shown in FIG. 1, program product 22 may include a net shape determinator 24, a sorter 26, a plane sweep algorithm 28, a new shape creator 30, a new shape spacing determinator 32, a design rule checker 34, a router 36, and other system components 40. Other system components 40 include any other function required for implementation of the invention not otherwise explicitly described herein.

Although system 100 according to the invention has been illustrated as a separate component, it should be recognized that the system can be incorporated as part of a larger design system.

Figure 2:
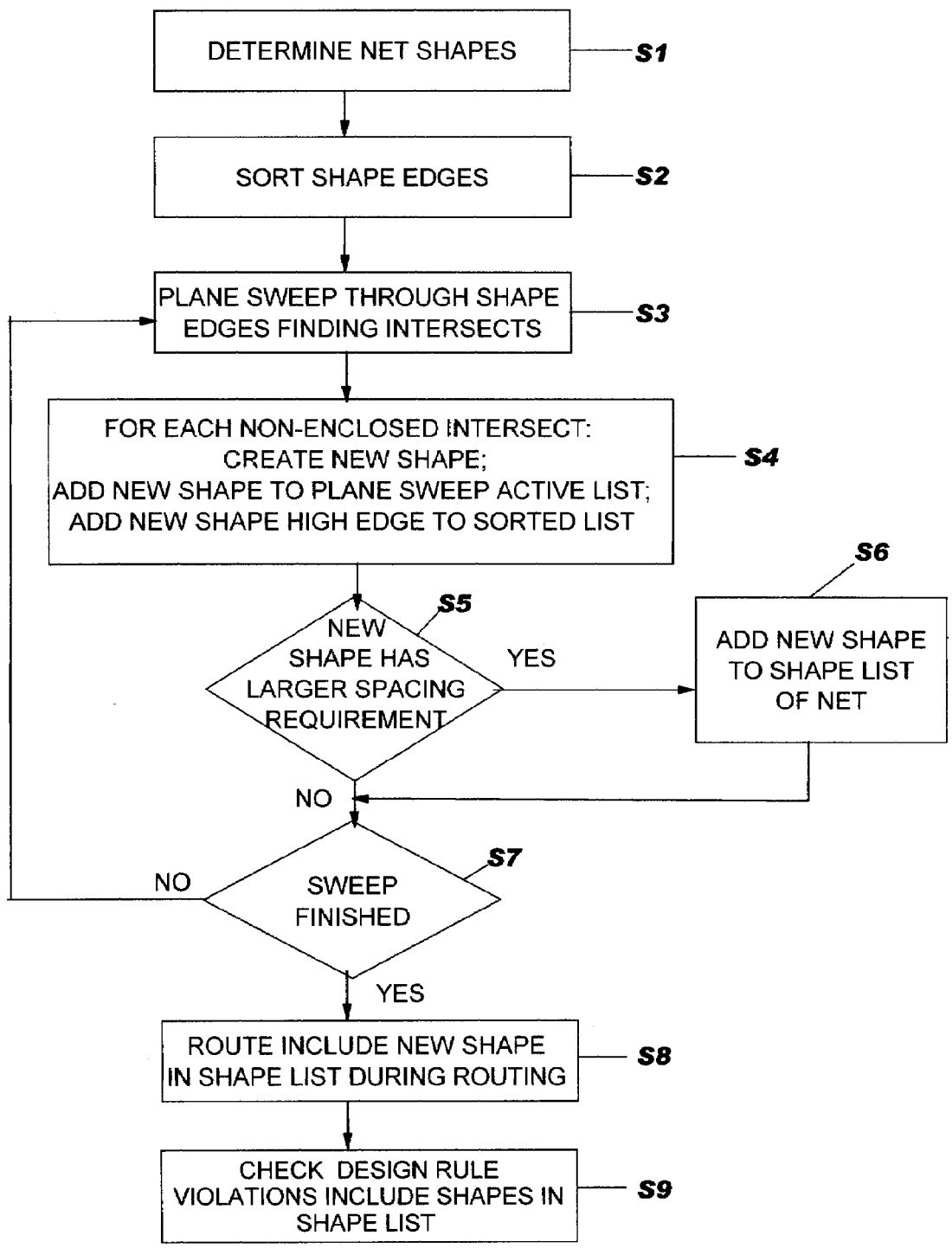
FIG. 2 shows a flow diagram of operational methodology of the design system of FIG. 1.
Figure 3:
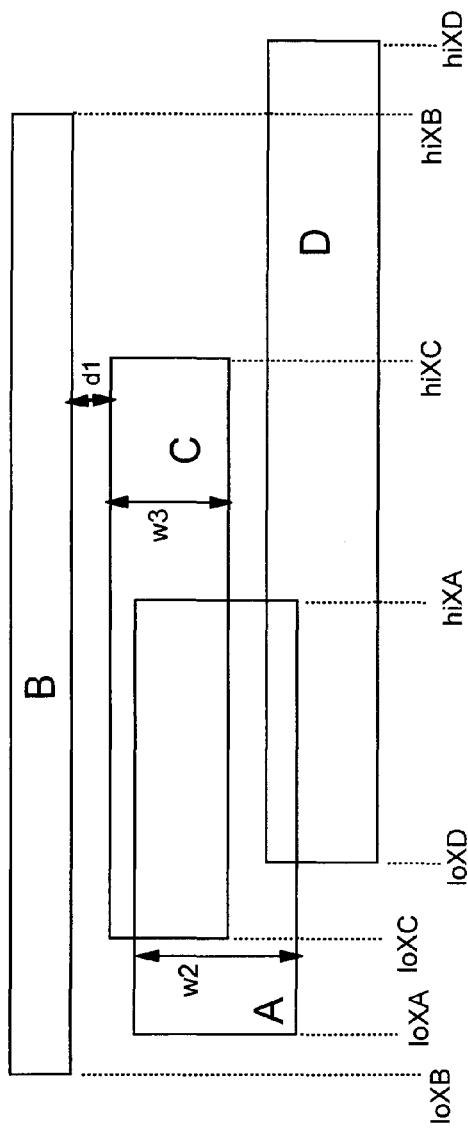
FIG. 3 shows an IC design used with the description of the flow diagram of FIG. 2.
Figure 4:
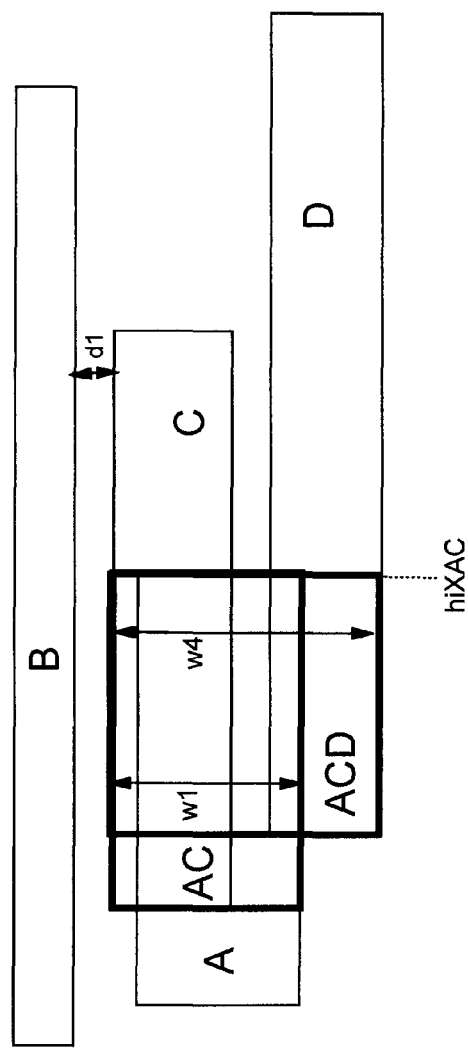
FIG. 4 shows the IC design of FIG. 3 including new shapes.

Turning to FIG. 2, a flow diagram of one embodiment of operational methodology of system 10 will now be described. An illustrative IC design is shown in FIGS. 3-4. Referring to FIG. 2 in conjunction with FIG. 1, in a first step S1, net shapes for a particular net of the IC are determined by net shape determinator 24. This step may include conducting an analysis of a net list to determine which shapes are associated with that net in a known fashion. Design shapes are represented as rectangles.

In a second step S2, edges of the net shapes are sorted by sorter 26 into a sorted list in order in preparation for a well known plane sweep algorithm (also referred to as scan line algorithm) for detecting shape intersections. For a primarily horizontal metal level in the design, the method uses the upper and lower shape edges in an ascending order and a horizontal scan line. For a primarily vertical metal level in the design, the method uses the right and left shape edges and a vertical scan line.

In a third step S3, a well known plane sweep algorithm 28 sweeps a scan line through the sorted list of net shape edges, stopping at each edge in the list. If the shape edge is a low edge, the shape is added to the active list of shapes. For example, as each low edge (e.g., loXA, loXB, loXC, loXD) of each shape A-D in FIG. 3 is detected, the respective shape is added the active list. The scan line located at this edge passes through all shapes currently on the active list. As such, any shape on the active list at the time is a candidate for intersecting the low edge shape. The algorithm checks for an intersection of shapes just added to the active list and the shapes on the active list and proceeds to step S4. If the shape edge in the sorted list is a high edge (e.g., hiXA, hiXB, hiXC, hiXD in FIG. 3), the shape is simply removed from the active list and the algorithm sets the scan line to the next shape edge in the sorted list and repeats step S3 until the sorted list is exhausted.

In a fourth step S4, any intersection noted in step S3 is examined by new shape creator 30. If the intersection is not totally contained by one of the intersecting shapes, a new, wider shape is created by assigning the edges of the new shape to be distal edges of the intersecting shapes. For example, as shown FIG. 4, the upper and lower edges of a new shape AC formed by the intersection of shape A and shape C in FIG. 3 are the upper edge of shape C and the lower edge of shape A. New shape AC has a width w1, as shown in FIG. 4. New shape AC is added to the active list by new shape creator 30, and subsequently compared to other active shapes, thus allowing the algorithm to detect cases where more than two shapes interact to form larger, wider shapes. Finally, a high edge of the new shape (e.g., hiXAC in FIG. 4) is inserted into the sorted list of edges by new shape creator 30, allowing the new shape to be removed from the active list when appropriate. In the vertical scanline illustrated, the high edge would be the upper edge of the new shape (e.g., hiXAC in FIG. 4). The active list, at this time, would include shapes present in the IC design, i.e., A, B, C and new shape AC.

In a fifth step S5, a determination is made by new shape spacing determinator 32 as to whether new shape AC (FIG. 4) requires a larger spacing than the intersecting shapes A and C (FIG. 3), i.e., whether the spacing requirement for a shape of the new shape size is larger than the spacing requirements of its component shapes. If so, as shown in step S6, the new shape is added to a shape list for the net by determinator 32. For example, in FIG. 4, if the new shape AC, with width w1, requires a larger spacing than a width w2 of shape A (FIG. 3) or a width w3 of shape C (FIG. 3), new shape AC is added to the shape list for the net. As shown in FIG. 3, a spacing between shape B and shape C may be required to be d1. However, where shape C intersects shape A, thus forming new shape AC, the spacing between shape B and shape C (and new shape AC) may be required to be larger than d1, thus causing a DRC violation.

Next, in step S7, plane sweep algorithm 28 sets the scan line to the next edge in the sorted list and returns to step S3. Once the scan line has reached the end of the sorted list, i.e., all edges on the sorted list have been evaluated, the sweep is finished, and processing continues to step S8. In particular, returning to FIG. 3, when the scan line reaches the low edge of shape D, loXD, shape D is added to the active list. Shapes AC, A, B and C are also on the active list. Shape D is found to intersect with shape AC, and a new shape ACD (FIG. 4), of width w4, is created, added to the active list and potentially added to the shape list. As the plane sweep reaches edge hiXA (equivalent to hiXAC and hiXACD) (FIG. 3), shapes A, AC, ACD are removed from the active list. As the plane sweep reaches edge hiXC, shape C is removed from the active list. Similarly, as the plane sweep reaches edge hiXB, shape B is removed, and as the plane sweep reaches edge hiXD, shape D is removed, and the algorithm has completed the new shape creation for the net.

At step S8, router 36 routes the IC design and includes any new shape in the shapes list for the net as a blockage while routing other nets to prevent spacing violations due to overlapping shapes during routing. Routing may include power routing, clock routing or detail routing. Hence, steps S1-S7 occur prior to routing, which allows the invention to prevent repetitive routing and design rule checking. This step may also include removing any new shape as a blockage after routing. This step may also include including created shapes on the shape list as shapes on the net during routing.

The above-described method may also include optional step S9, checking the IC design for design rule spacing violations using shorts and spacing checker 34. This step includes evaluating the new shapes on the shapes list for the net during checking so as to find spacing violations due to overlapping shapes.

The above-described method may include a loop through all or a subset of the nets of the IC design, storing the new shape list for each net to be used by checking or routing algorithms.

In the previous discussion, it will be understood that the method steps discussed are performed by a processor, such as PU 14 of system 10, executing instructions of program product 22 stored in memory. It is understood that the various devices, modules, mechanisms and systems described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which when loaded in a computer system is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

The invention claimed is:

1. A method of designing an integrated circuit (IC) design, the method comprising the steps of:
   determining net shapes for a net;
   sorting edges of the net shapes in preparation for a plane sweep into a sorted list;
   using a plane sweep algorithm to detect an intersection of at least two shapes;
   creating a new shape from the intersecting shapes in the case that the intersection is not totally contained by one of the intersecting shapes, and adding the new shape to an active list of the plane sweep;
   adding the new shape to a shapes list for the net in the case that the new shape requires a larger spacing than the intersecting shapes; and
   routing the IC design and including the new shape on a shapes list for the net as a blockage to prevent spacing errors during routing.

2. The method of claim 1, further comprising the step of checking the design for design rule violations.

3. The method of claim 2, further comprising the step of including shapes on the shape list as shapes on the net during the checking step.

4. The method of claim 1, further comprising the step of removing the new shape as a blockage after the routing step.

5. The method of claim 1, wherein the creating step includes assigning edges of the new shape to be distal edges of the intersecting shapes.

6. The method of claim 1, wherein the creating step further includes adding a high edge of the new shape into the sorted list.

7. The method of claim 1, wherein the using, creating and adding steps are repeated until all edges on the sorted list have been evaluated.

8. A system for designing an integrated circuit (IC) design, the system comprising:
   means for determining net shapes for a net;
   means for sorting edges of the net shapes in preparation for a plane sweep into a sorted list;
   means for using a plane sweep algorithm to detect an intersection of at least two shapes;
   means for creating a new shape from the intersecting shapes in the case that the intersection is not totally contained by one of the intersecting shapes, and adding the new shape to an active list of the plane sweep;
   means for adding the new shape to a shapes list for the net in the case that the new shape requires a larger spacing than the intersecting shapes; and
   means for routing the IC design and including the new shape on a shapes list for the net as a blockage to prevent spacing errors during routing.

9. The system of claim 8, further comprising means for checking the design for design rule violations.

10. The system of claim 9, wherein the checking means further includes shapes on the shape list as shapes on the net during the checking step.

11. The system of claim 8, wherein the routing means further removes the new shape as a blockage after the routing step.

12. The system of claim 8, wherein the creating means assigns edges of the new shape to be distal edges of the intersecting shapes.

13. The system of claim 8, wherein the creating means further adds a high edge of the new shape into the sorted list.

14. The system of claim 8, wherein the using, creating and adding means repeat their functions until all edges on the sorted list have been evaluated.

15. A computer program product comprising a computer useable medium having computer readable program code embodied therein for designing an integrated circuit (IC) design, the program product comprising:
   program code configured to determine net shapes for a net;
   program code configured to sort edges of the net shapes in preparation for a plane sweep into a sorted list;
   program code configured to use a plane sweep algorithm to detect an intersection of at least two shapes;
   program code configured to create a new shape from the intersecting shapes in the case that the intersection is not totally contained by one of the intersecting shapes, and adding the new shape to an active list of the plane sweep;
   program code configured to add the new shape to a shapes list for the net in the case that the new shape requires a larger spacing than the intersecting shapes; and
   program code configured to route the IC design and including the new shape on a shapes list for the net as a blockage to prevent spacing errors during routing.

16. The program product of claim 15, further comprising program code configured to check the design for design rule violations.

17. The program product of claim 16, wherein the checking code further includes shapes on the shape list as shapes on the net during the checking step.

18. The program product of claim 15, wherein the routing code further removes the new shape as a blockage after the routing step.

19. The program product of claim 15, wherein the creating code assigns edges of the new shape to be distal edges of the intersecting shapes.

20. The program product of claim 15, wherein the creating code further adds a high edge of the new shape into the sorted list.

* * * * *